(12) United States Patent
Eberler et al.

(10) Patent No.: US 10,534,051 B2
(45) Date of Patent: Jan. 14, 2020

(54) MR RADIO-FREQUENCY SHIELDING UNIT

(71) Applicant: Siemens Healthcare GmbH, Erlangen (DE)

(72) Inventors: Ludwig Eberler, Neumarkt i.d.OPf. (DE); Jürgen Nistler, Erlangen (DE); Markus Vester, Nürnberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/007,886

(22) Filed: Jun. 13, 2018

(65) Prior Publication Data

US 2018/0364322 A1   Dec. 20, 2018

(30) Foreign Application Priority Data

Jun. 14, 2017 (EP) ...................... 17176031

(51) Int. Cl.
*G01V 3/00* (2006.01)
*G01R 33/422* (2006.01)
*H01Q 7/00* (2006.01)
*G01R 33/34* (2006.01)
*H01Q 1/52* (2006.01)

(52) U.S. Cl.
CPC ............. *G01R 33/422* (2013.01); *H01Q 7/00* (2013.01); *G01R 33/34007* (2013.01); *H01Q 1/526* (2013.01)

(58) Field of Classification Search
CPC .................................................. G01R 33/422
USPC .................................................. 324/322, 318
See application file for complete search history.

(56) References Cited

U.S. PATENT DOCUMENTS

| 6,232,548 | B1 | 5/2001 | Eberler et al. |
| 7,501,823 | B2 | 3/2009 | Nistler et al. |
| 8,766,632 | B2 | 7/2014 | Biber et al. |
| 2012/0229141 | A1* | 9/2012 | Brown ................. G01R 33/422 324/322 |
| 2013/0300418 | A1 | 11/2013 | Eberler et al. |
| 2014/0194727 | A1* | 7/2014 | Boskamp ........... G01R 33/0076 600/411 |

(Continued)

FOREIGN PATENT DOCUMENTS

| CN | 105823997 A | 8/2016 |
| CN | 205787069 U | 12/2016 |
| DE | 19843905 C2 | 9/2000 |

(Continued)

OTHER PUBLICATIONS

European Office Action for European Patent Application No. 17176031. 17-1210 dated Jun. 20, 2018, with English translation.

(Continued)

*Primary Examiner* — Louis M Arana
(74) *Attorney, Agent, or Firm* — Lempia Summerfield Katz LLC

(57) ABSTRACT

A radio-frequency shielding unit for shielding a radio-frequency antenna unit of a magnetic resonance apparatus and a magnetic resonance apparatus are provided. The radio-frequency shielding unit includes a support layer, a first conducting layer, an insulating layer, and a second conducting layer. The first conducting layer is arranged between the support layer and the insulating layer, and the insulating layer is arranged between the first conducting layer and the second conducting layer.

10 Claims, 3 Drawing Sheets

(56) References Cited

U.S. PATENT DOCUMENTS

2014/0285201 A1* 9/2014 Freytag .............. G01R 33/4215
                                                      324/322
2015/0253401 A1* 9/2015 Rapoport ............... A61B 5/055
                                                      324/318

FOREIGN PATENT DOCUMENTS

EP          2175289 A1    4/2010
WO          WO9119994 A1  12/1991

OTHER PUBLICATIONS

European Search Report for European Patent Application No. 17176031.7-1210, dated Mar. 21, 2018.
European Search Report for European Patent Application No. 17176031.7-1914, dated Dec. 8, 2017.
ip.com Journal, ip.com Inc. "Carbon Fiber Radiofrequency Shield for Magnetic Resonance Imaging", ip.com Journal, ip.com Inc., West Henrietta, NY, US. (Jun. 20, 2014), XP013163148, ISSN: 1533-0001.
Chinese Office Action for Chinese Application No. 201810605923.8 dated Apr. 16, 2019.

* cited by examiner

MR RADIO-FREQUENCY SHIELDING UNIT

This application claims the benefit of European Application No. EP17176031.7, filed on Jun. 14, 2017, which is hereby incorporated by reference in its entirety.

BACKGROUND

The present embodiments relate to a radio-frequency shielding unit for shielding a radio-frequency antenna unit of a magnetic resonance apparatus and to a magnetic resonance apparatus.

Magnetic Resonance Imaging (MRI) is a known technique for producing magnetic resonance images of a patient and is based on the physical phenomenon of magnetic resonance (MR). This technique uses a radio-frequency antenna unit to radiate excitation pulses into the patient during a magnetic resonance measurement in order to trigger magnetic resonance signals. For spatial encoding of the magnetic resonance signals, the magnetic resonance apparatus also includes a gradient coil unit that is used to generate magnetic field gradients. The magnetic field gradients are superimposed on a static main magnetic field $B_0$ that is generated by a main magnet.

A transmit antenna that is fixedly integrated in the magnetic resonance apparatus is normally used as the radio-frequency antenna unit, and is often referred to as a whole-body radio-frequency coil or body coil for short. It is standard practice to bound the actual radio-frequency antenna unit by a radio-frequency shielding unit (e.g., a radio frequency shield, RF shield or shield). The documents U.S. Pat. No. 7,501,823 B2, U.S. Pat. No. 8,766,632 B2, and US 20130300418 A1 describe different exemplary embodiments of radio-frequency shielding units.

A radio-frequency shielding unit may include a ground plane and hence also a surface for image currents from the radio-frequency antenna unit. The radio-frequency shielding unit may be arranged between the radio-frequency antenna unit and the gradient coil unit, which is normally arranged further out with respect to a patient placement zone. The radio-frequency shielding unit is often mounted directly on an inside face of the gradient coil unit.

The radio-frequency shielding unit may conduct high frequency currents as effectively as possible in order to provide optimum efficiency of the radio-frequency antenna unit. Low-frequency eddy currents, which may be induced by fields from the gradient coil unit, are meant to be minimized as far as possible in order to prevent heating of the radio-frequency shielding unit. The fields from the eddy currents may extend even into the patient and cause there image interference and/or image artifacts in a magnetic resonance measurement.

Coupled-in noise (e.g., in the form of field spikes) that may be caused by switching pulses of gradient amplifiers, for example, may present another problem. Associated interference may likewise be attenuated by the radio-frequency shielding unit to avoid any impact on the imaging.

In order to satisfy all the requirements at once (e.g., high efficiency of the transmit antenna, sufficient suppression of eddy currents, and sufficient attenuation of interference), radio-frequency shielding units have long been in use that consist of printed circuit board material having copper layers applied on both sides (e.g., the front and back of the printed circuit board material is copper-coated). Both copper layers contribute to the shielding effect of the radio-frequency shielding unit.

In the past, radio-frequency shielding units of such a design have been well-suited to magnetic resonance apparatuses in which the main magnetic field $B_0$ has a strength of typically 1.5 or 3 T. Such radio-frequency shielding units, however, exhibit significantly higher losses and significantly lower attenuating effects on external interference for magnetic resonance apparatuses in which the main magnetic field $B_0$ is of lower strength (e.g., less than 1 T).

SUMMARY AND DESCRIPTION

The scope of the present invention is defined solely by the appended claims and is not affected to any degree by the statements within this summary.

The present embodiments may obviate one or more of the drawbacks or limitations in the related art. For example, a radio-frequency shielding unit that is suitable for magnetic resonance apparatuses having a low main magnetic field $B_0$ is provided.

A radio-frequency shielding unit for shielding a radio-frequency antenna unit of a magnetic resonance apparatus is provided. The radio-frequency shielding unit includes at least the following four layers: a support layer, a first conducting layer, an insulating layer, and a second conducting layer. The first conducting layer is arranged between the support layer and the insulating layer, and the insulating layer is arranged between the first conducting layer and the second conducting layer.

A layer may, for example, be an element of the radio-frequency shielding unit. The element is planar in design. A layer may have a layer plane that, for example, is two-dimensional, although the layer plane may be curved in design. In addition, a layer has a lateral extent parallel to the layer plane, and a perpendicular extent perpendicular to the layer plane. The perpendicular extent may also be referred to as the layer thickness. In this context, the lateral extent of a layer is significantly greater (e.g., more than 1,000 times greater) than the perpendicular extent.

The support layer, the first conducting layer, the insulating layer, and the conducting layer are integrally and/or directly connected to one another (e.g., at the atomic and/or molecular level; the support layer, the first conducting layer, the insulating layer, and the conducting layer form an integral and/or direct layer composite). For example, the layers are applied to one another successively by coating processes starting from the support layer in order to produce ultimately the proposed layered construction (e.g., support layer/first conducting layer/insulating layer/second conducting layer).

The support layer gives the radio-frequency shielding unit sufficient stability and/or robustness (e.g., with respect to any mechanical loads), so that damage may be avoided. In addition, the support layer advantageously allows greater scope in the way in which the radio-frequency shielding unit may be produced. For example, the support layer may act as a substrate for applying further layers (e.g., the first conducting layer, the insulating layer, and the second conducting layer).

In this context, a conducting layer may be an electrically conductive layer. The first conducting layer and the second conducting layer thus each include, for example, at least one electrically conductive material (e.g., a material having a high electrical conductivity that typically at a temperature of 25° C. is greater than $10^3$ S/m; greater than $10^6$ S/m).

The support layer and/or the insulating layer may be electrically insulating layers. The support layer and/or the insulating layer may each include at least one electrically insulating material (e.g., a material having a low electrical conductivity that typically at a temperature of 25° C. is less than 1 S/m, less than $10^{-3}$ S/m, or less than $10^{-6}$ S/m).

The spatial separation of the two conducting layers by the insulating layer produces an electrical capacitance that contributes to the function of the radio-frequency shielding unit. For example, a high-frequency current path, which is interrupted by any discontinuities in a conducting layer, may be diverted via a capacitance into another conducting layer. The capacitance is governed by the thickness and/or the dielectric constant (e.g., the relative permittivity $\varepsilon_r$) of the insulating layer. The insulating layer may thus also be regarded as a dielectric here.

Conventional radio-frequency shielding units are usually constructed from three layers (e.g., from two conducting layers and an intermediate layer lying therebetween, said intermediate layer acting as both insulating layer and support layer). The intermediate layer thus acts not only electrically as a dielectric but also mechanically as a mechanical support. This dual function of the intermediate layer severely limits the options for adapting the radio-frequency shielding unit to the requirements of magnetic resonance apparatuses that have a low main magnetic field $B_0$. This problem may be addressed according to one or more of the present embodiments by separating the dual function and dedicating a separate layer (e.g., the support layer and the insulating layer) to each of the two functions.

The first conducting layer may be a metal layer (e.g., a copper layer). Metals (e.g., copper) have particularly high electrical conductivities. Copper is also easily available and may be processed easily.

The first conducting layer may have a layer thickness between 1 and 50 µm (e.g., 5 and 30 µm or 9 and 18 µm). A sufficiently low electrical sheet resistance of the layer may be achieved by such layer thicknesses. This may provide, for example, that the transmit antenna has a high efficiency.

The support layer may include a composite material including, for example, epoxy resin and woven fiberglass cloth. For example, the support layer includes a support material for printed circuit boards (e.g., a material such as FR4). The desired properties of the support layer (e.g., with regard to the mechanical requirements) may be achieved particularly precisely by a composite material. Composite materials may have a comparatively high stability for a low weight. For example, printed circuit board material is also easily available and economical.

The support layer preferably has a layer thickness of at least 0.1 mm, in particular at least 0.4 mm, in particular at least 0.7 mm. A support layer having such a layer thickness can be used to design the radio-frequency shielding unit to be particularly robust and/or less prone to mechanical damage.

The first conducting layer and/or the second conducting layer may include at least one (e.g., lateral) discontinuity (e.g., there are one or more regions in the layer plane that are devoid of electrically conductive material). The at least one discontinuity may be elongated and/or slotted in design (e.g., in the form of an isolating slot). The at least one discontinuity may form, for example, a slotted structure. Eddy currents that would otherwise flow in the layer may be suppressed by the at least one discontinuity. Heating of the radio-frequency shielding unit may thereby be minimized.

By virtue of the proposed layered construction, the insulating layer (e.g., the layer that separates the first conducting layer and the second conducting layer from one another) may have a particularly thin design. The insulating layer may have a layer thickness of 50 µm maximum, 20 µm maximum, or 10 µm maximum).

For magnetic resonance apparatuses having a low main magnetic field $B_0$, the capacitance formed between the two conducting layers may be adjusted as the reciprocal of the strength of the main magnetic field $B_0$. For example, if the strength of the main magnetic field $B_0$ is reduced by a factor of 3 from 1.5 T to 0.5 T, the capacitance is increased by the same factor 3. Increasing the capacitance may be achieved, for example, by reducing the layer thickness, because usually there is an indirect proportionality between the layer thickness and the capacitance.

Since in conventional radio-frequency shielding units, the intermediate layer between the two conducting layers is also to provide the stability of the radio-frequency shielding unit, usually layer thicknesses of less than 100 µm may not be used because the radio-frequency shielding unit would otherwise be too prone to mechanical damage.

The insulating layer may have a dielectric constant of at least 2, at least 4, or at least 6.

For magnetic resonance apparatuses having a low main magnetic field $B_0$, an insulating layer having a high dielectric constant may be provided for achieving a high capacitance between the two conducting layers.

The insulating layer may include polymers. Polymer layers may be configured to be particularly thin, and hence, high capacitances may be achieved between the two conducting layers.

The insulating layer may include nanoparticles, which may be added to the polymers, for example. Nanoparticles may be used to set systematically the dielectric constant and hence the capacitance between the two conducting layers. A dielectric constant of the insulating layer may be achieved in this manner. Nanoparticles having a dielectric constant higher than, for example, 8 are advantageously used here. High-k dielectrics and/or ceramic nanoparticles such as, for example, aluminum oxide are suitable.

The insulating layer may be applied to the first conducting layer at least in part by a spray-coating process. Spray-coating processes may be used to apply the insulating layer particularly easily.

Another option is to apply the insulating layer to the first conducting layer at least in part by a printing process (e.g., a screen-printing process). Printing processes may be used to apply the insulating layer particularly easily.

The second conducting layer may be applied to the insulating layer at least in part by a spray-coating process. Spray-coating processes may be used to apply the second conducting layer particularly easily and/or thinly.

Another option is to apply the second conducting layer to the insulating layer at least in part by a printing process (e.g., a screen-printing process). Printing processes may be used to apply the second conducting layer particularly easily and/or thinly.

A paste containing copper and/or aluminum and/or carbon nanotubes may be applied by the printing process. Pastes may be printed particularly well. Copper and/or aluminum advantageously have a high electrical conductivity.

The thickness of the second conducting layer may be increased by an electrochemical process (e.g., galvanically). Higher layer thicknesses may thereby be achieved advantageously in order to minimize the electrical surface resistance of the second conducting layer.

The radio-frequency shielding unit optionally includes at least one additional insulating layer and at least one additional conducting layer. In this case, the at least one additional insulating layer is arranged between two conducting layers (e.g., the layered construction includes alternately conducting layers and insulating layers). Thus, at least one insulating layer may be arranged between two conducting layers.

Such a construction allows, for example, greater scope in the design of the radio-frequency shielding unit, so that the design of the radio-frequency shielding unit may be optimized even further. For example, the radio-frequency shielding unit may thereby further increase the efficiency of a transmit antenna, and/or potential interference may be attenuated even more effectively by the radio-frequency shielding unit.

One embodiment of the radio-frequency shielding unit provides that the at least one insulating layer and the at least one additional conducting layer have a different lateral extent compared with the support layer and/or the first conducting layer and/or the insulating layer and/or the second conducting layer. The at least one insulating layer and the at least one additional conducting layer may have a locally defined design. It is thereby possible for the design of the radio-frequency shielding unit to take even more specific account of local circumstances and/or requirements.

A method for producing a radio-frequency shielding unit is also provided.

According to one embodiment of the method, the insulating layer is applied to the first conducting layer at least in part by a spray-coating process.

According to another embodiment of the method, the insulating layer is applied to the first conducting layer at least in part by a printing process.

According to another embodiment of the method, the second conducting layer is applied to the insulating layer at least in part by a spray-coating process.

According to another embodiment of the method, the second conducting layer is applied to the insulating layer at least in part by a printing process.

According to another embodiment of the method, a paste containing copper and/or aluminum and/or carbon nanotubes is applied by the printing process.

According to another embodiment of the method, the thickness of the second conducting layer is increased by an electrochemical process.

With regard to the advantages of the embodiments of the method, reference is made to the advantages of the embodiments of the radio-frequency shielding unit that are presented above.

In addition, a magnetic resonance apparatus having a radio-frequency antenna unit and a gradient coil unit is provided. The magnetic resonance apparatus includes a radio-frequency shielding unit as described above, which is arranged between the radio-frequency antenna unit and the gradient coil unit. For example, the radio-frequency shielding unit may reduce the coupling of interference into the radio-frequency antenna unit.

One embodiment of the magnetic resonance apparatus provides that the support unit is arranged on that side of the radio-frequency shielding unit that faces the gradient coil unit. During fabrication, the radio-frequency shielding unit is often first fitted onto the gradient coil unit in a first act, and then, the radio-frequency antenna unit is fitted onto the radio-frequency shielding unit and/or gradient unit in a second act. Hence, the embodiment in which the support unit is arranged on that side of the radio-frequency shielding unit that faces the gradient coil unit has the advantage, for example, of providing easier access to the conducting layers, which are then located inside in order to connect, for example, any capacitors and/or ground straps.

According to an alternative embodiment of the magnetic resonance apparatus, the support unit is arranged on that side of the radio-frequency shielding unit that faces away from the gradient coil unit. This embodiment, for example, has the advantage that very good mechanical protection from damage is provided by the support layer, which is then located inside.

DETAILED DESCRIPTION

Figure 1:
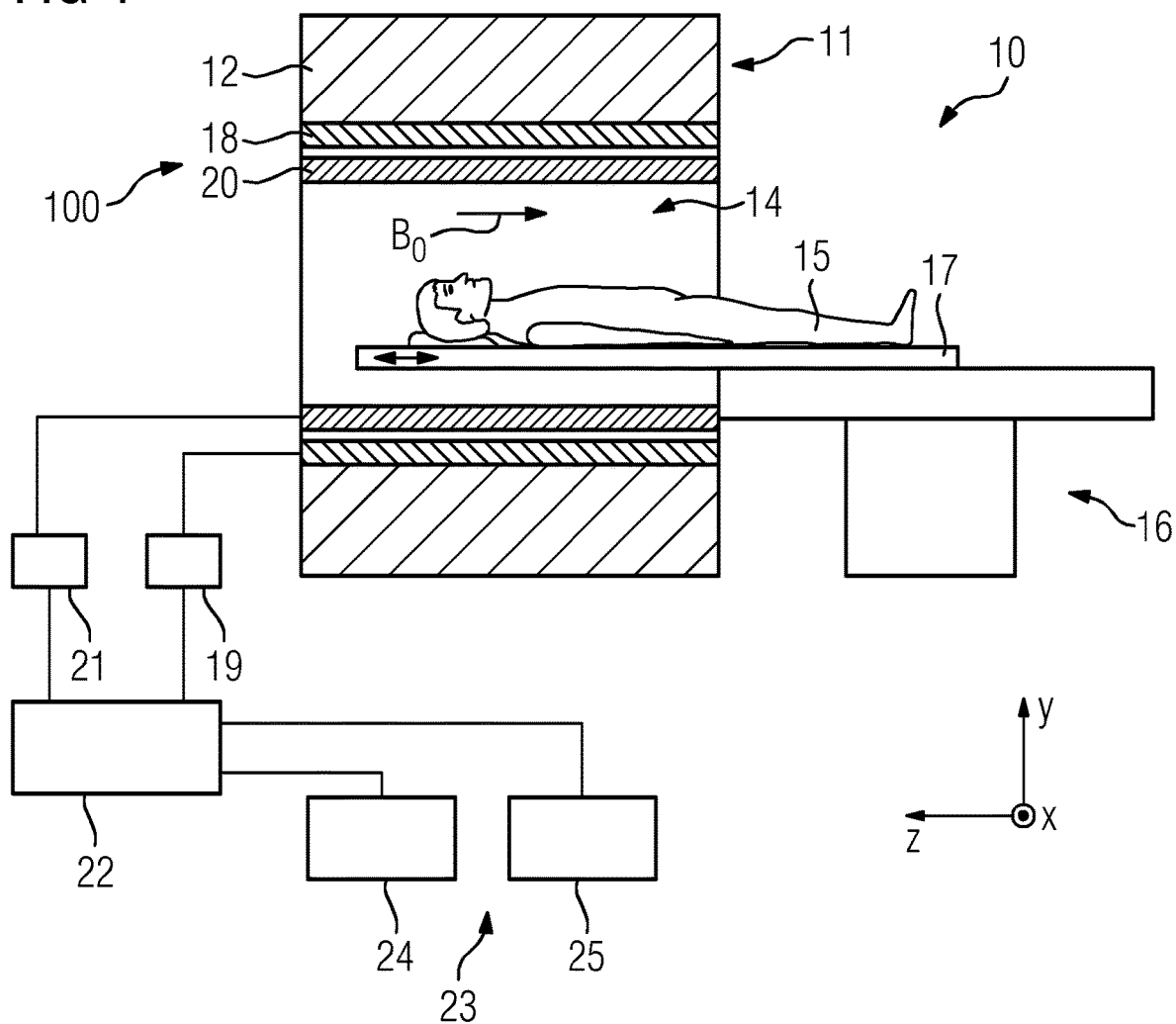
FIG. 1 shows a diagram of one embodiment of a magnetic resonance apparatus.

FIG. 1 is a schematic representation of one embodiment of a magnetic resonance apparatus 10. The magnetic resonance apparatus 10 includes a magnet unit 11. The magnet unit 11 includes a main magnet 12 for producing a powerful main magnetic field $B_0$ that, for example, is constant over time. The magnetic resonance apparatus 10 also includes a patient placement zone 14 for accommodating a patient 15. The patient 15 may be moved into the patient placement zone 14 by a patient support apparatus 16 of the magnetic resonance apparatus 10. The patient support apparatus 16 includes, for this purpose, a patient couch 17 that is configured to be able to move inside the patient placement zone 14.

The magnet unit 11 further includes a gradient coil unit 18 for generating magnetic field gradients that are used for spatial encoding during imaging. The gradient coil unit 18 is controlled by a gradient control unit 19 of the magnetic resonance apparatus 10. The magnet unit 11 also includes a radio-frequency antenna unit 20 that, in the present exemplary embodiment, is configured as a body coil that is fixedly integrated in the magnetic resonance apparatus 10. The radio-frequency antenna unit 20 is configured to excite atomic nuclei. The excitation is established in the main magnetic field $B_0$ produced by the main magnet 12. The radio-frequency antenna unit 20 is controlled by a radio-frequency antenna control unit 21 of the magnetic resonance apparatus 10 and radiates high-frequency magnetic resonance sequences into an examination space that is largely formed by a patient placement zone 14 of the magnetic resonance apparatus 10. The radio-frequency antenna unit 20 is also configured to receive magnetic resonance signals.

Figure 2:
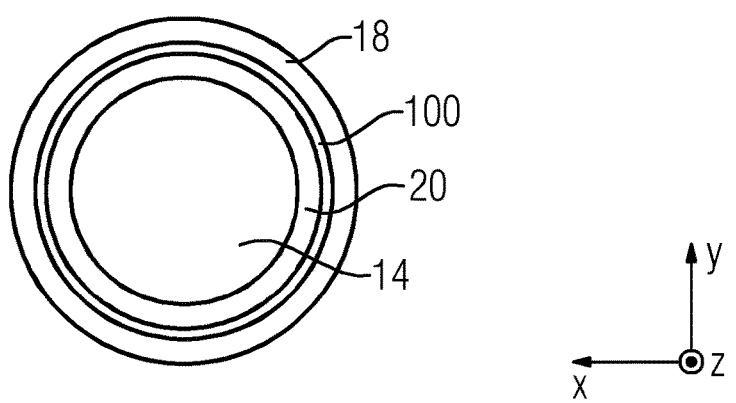
FIG. 2 shows a diagram of one embodiment of a radio-frequency antenna unit and a gradient coil unit having a radio-frequency shielding unit lying therebetween.

The magnetic resonance apparatus 10 also includes a radio-frequency shielding unit 100 for shielding the radio-frequency antenna unit 20. The radio-frequency shielding unit 100 is arranged between the gradient coil unit 18 and the radio-frequency antenna unit 20. As also shown in FIG. 2, the radio-frequency shielding unit 100, the gradient coil unit 18 and the radio-frequency antenna unit 20 are cylindrical in form in the present exemplary embodiment. In this case, the radio-frequency shielding unit 100, the gradient coil unit 18, and the radio-frequency antenna unit 20 extend about a z-axis as the cylinder axis. In principle, however, a different geometry may be provided.

The magnetic resonance apparatus 10 includes a system control unit 22 for controlling the main magnet 12, the gradient control unit 19, and the radio-frequency antenna control unit 21. The system control unit 22 centrally controls the magnetic resonance apparatus 10 (e.g., implementing a predetermined imaging gradient echo sequence). In addition, the system control unit 22 includes an analysis unit (not shown in further detail) for analyzing medical image data acquired during the magnetic resonance examination. In addition, the magnetic resonance apparatus 10 includes a user interface 23 that is connected to the system control unit 22. Control data such as imaging parameters, for example, and reconstructed magnetic resonance images may be displayed to medical personnel on a display unit 24 (e.g., on at least one monitor) of the user interface 23. In addition, the user interface 23 includes an input unit 25 that may be used by the medical operating personnel to enter data and/or parameters during a measurement process.

Figure 3:
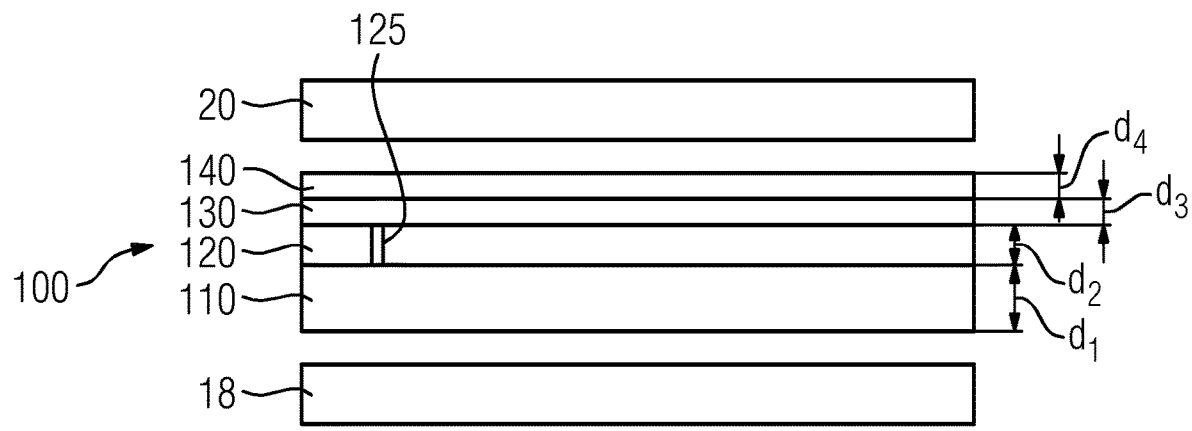
FIG. 3 shows a diagram of a radio-frequency shielding unit in a first arrangement variant.
Figure 4:
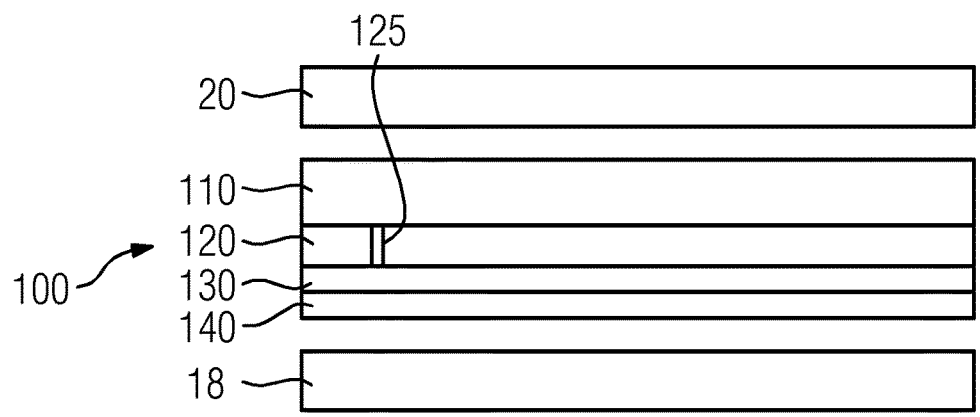
FIG. 4 shows a diagram of a radio-frequency shielding unit in a second arrangement variant.

FIG. 3 and FIG. 4 each show in sectional views a segment of a radio-frequency shielding unit 100 in different arrangement variants relative to the gradient coil unit 18 and the radio-frequency antenna unit 20. As simplification, the radio-frequency shielding unit 100 is shown as, for example, a flat developed view along the circumference about the z-axis. The variant shown in FIG. 3, in which the support unit 110 is arranged on the side of the radio-frequency shielding unit 100 that faces the gradient coil unit 18, allows easier access to the second conducting layer 140, which is then located inside, in order to connect any components, for example. The variant shown in FIG. 4, in which the support unit 110 is arranged on that side of the radio-frequency shielding unit 100 that faces away from the gradient coil unit 18, provides very good mechanical protection from damage.

For simplicity, FIG. 3 and FIG. 4 show a flat layered construction, although this construction may also be curved, as shown in FIG. 1 or FIG. 2, by way of example. In both cases, the radio-frequency shielding unit 100 includes a support layer 110, a first conducting layer 120, an insulating layer 130, and a second conducting layer 140. The first conducting layer 120 is arranged between the support layer 110 and the insulating layer 130, and the insulating layer 130 is arranged between the first conducting layer 120 and the second conducting layer 140.

The support layer 110 and the first conducting layer 120 may be part of a conventional printed circuit board, for example. The printed circuit board may include a composite material (e.g., a printed circuit board support material such as FR4) as the support layer 110 and a metal layer (e.g., a copper layer) as the first conducting layer 110. In one embodiment, the printed circuit board is coated with metal (e.g., copper) on only one side. In another embodiment, the printed circuit board is coated with metal on both sides (not shown here), in which case one of the two metal layers acts as the first conducting layer 120.

The thickness of the support layer $d_1$ in this case may be configured primarily or even entirely based on mechanical considerations (e.g., unlike the case for conventional RF shields, additional electrical aspects need not be taken into account).

Figure 5:
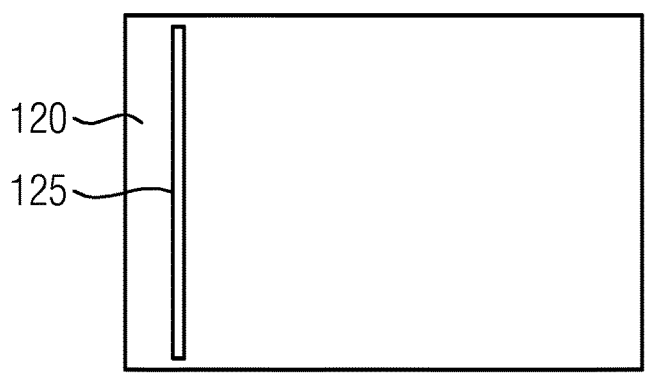
FIG. 5 shows a diagram of a first conducting layer having an isolating slot by way of example.

The first conducting layer 120 and/or second conducting layer 140 may optionally have a slotted structure. This is indicated, by way of example, by the isolating slot 125 in the first conducting layer 120. The isolating slot 125 constitutes a discontinuity in the first conducting layer 120. FIG. 5 shows, by way of example, a plan view of the first conducting layer 120 containing the isolating slot 125. The first conducting layer 120 and/or second conducting layer 140 may include even more discontinuities. Eddy currents in the first conducting layer 120 and/or second conducting layer 140 may be minimized by the at least one discontinuity.

The thicknesses $d_2$ and $d_4$ of the conducting layers 120, 140 are selected such that the electrical sheet resistance of the conducting layers 120, 140 is sufficiently low.

The insulating layer 130 may be applied to the first conducting layer 120 by, for example, spray-coating and/or in a printing process (e.g., a screen-printing process). Thin layer thicknesses $d_3$ of the insulating layer 130 may be achieved in this case. The layer thickness $d_3$ may be in the region of 20 μm, which provides that the layer thickness $d_3$ is significantly less than the intermediate layer of conventional RF shields. Capacitances that may be higher by a factor of 5 compared with conventional forms of production, which usually do not permit layer thicknesses of less than 100 μm, may thereby be achieved. Polymers, for example, may be used as the material for the insulating layer 130. The dielectric constant of the insulating layer 130, which may be between, may be controlled by the incorporation of nanoparticles. Loss factors tan δ of approximately 0.02, which may be in the order of magnitude of FR4 materials, may be achieved. The lower layer thickness $d_3$ provides that the losses have less impact overall because the Ohmic loss contribution decreases linearly with the layer thickness $d_3$.

The second conducting layer 140 may be applied after hardening of the insulating layer 130. Again, spray-coating and/or printing processes (e.g., screen-printing processes) may be provided for this. In one embodiment, a desired slotted structure may thereby also be created at this stage. Paste containing copper or aluminum, for example, may be used for the printing. In order to achieve sufficient electrical conductivity, the second conducting layer may also be increased in thickness (e.g., by electrochemical processes such as galvanization).

Figure 6:
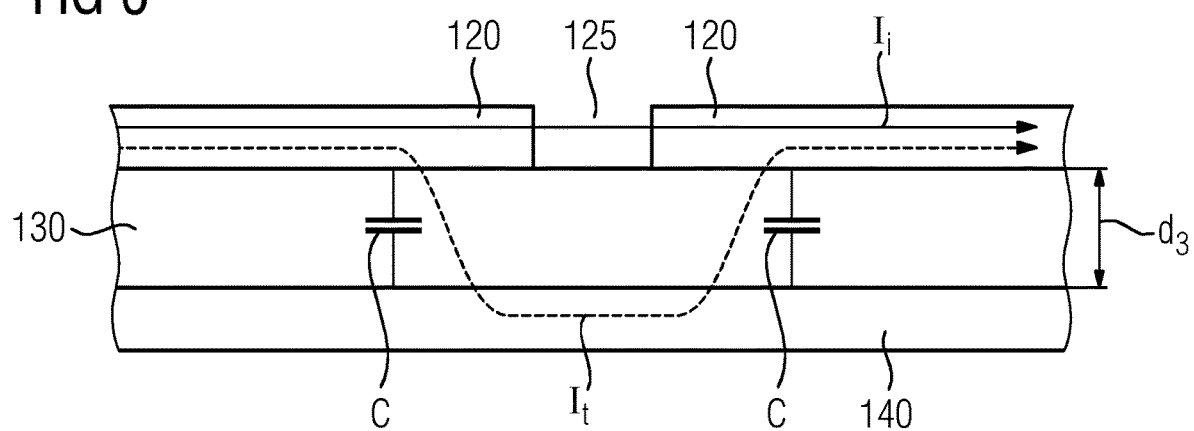
FIG. 6 shows a diagram of a layered construction containing high-frequency current paths.

FIG. 6 is used to explain how an electrical capacitance contributes to the function of the radio-frequency shielding unit 100. FIG. 6 shows the first conducting layer 120 and the second conducting layer 140, which are separated by the insulating layer 130. In this example, the first conducting layer 120 includes a discontinuity in the form of an isolating slot 125, although analogously it is also possible that the second conducting layer 140 includes a discontinuity.

Image currents from the radio-frequency antenna unit 20 may flow in the first conducting layer, but in this case, are prevented from flowing by the isolating slot 125 (e.g., an ideal current path $I_i$ is interrupted by the isolating slot 125). Since the current is a high-frequency current, however, the current may be coupled across via the capacitance C of the insulating layer 130 onto the second conducting layer 140, and from the second conducting layer 140 back into the first conducting layer 120. Hence, some of the current flows capacitively via the actual current path $I_r$. Normally, the greater the capacitance C, the better this coupling effect is. Usually it holds that $C \sim \varepsilon_r / d_3$, so that the insulating layer 130 has a high dielectric constant $\varepsilon_r$ and/or a low layer thickness $d_3$.

Figure 7:
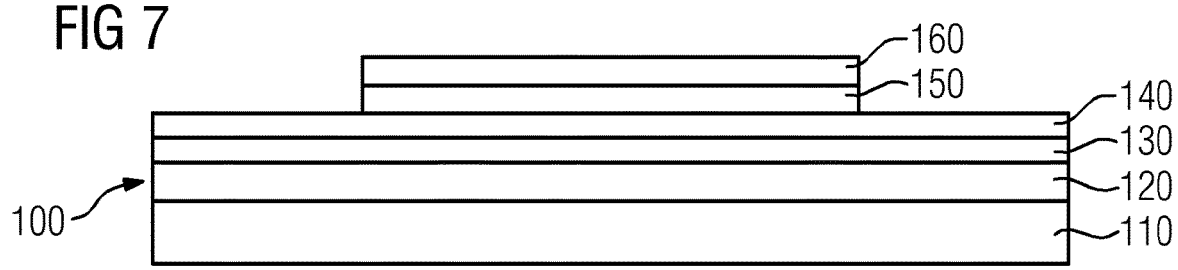
FIG. 7 shows a diagram of a radio-frequency shielding unit having an additional insulating layer and an additional conducting layer.

FIG. 7 shows one embodiment of a radio-frequency shielding unit 100 having an additional insulating layer 150 and an additional conducting layer 160. In one embodiment, the radio-frequency shielding unit 100 also includes even more additional alternately arranged insulating layers and conducting layers.

The additional insulating layer 150 and the additional conducting layer 160 have a different (e.g., smaller) lateral extent compared with the support layer 110, the first conducting layer 120, the insulating layer 130, and the second conducting layer 140.

Figure 8:
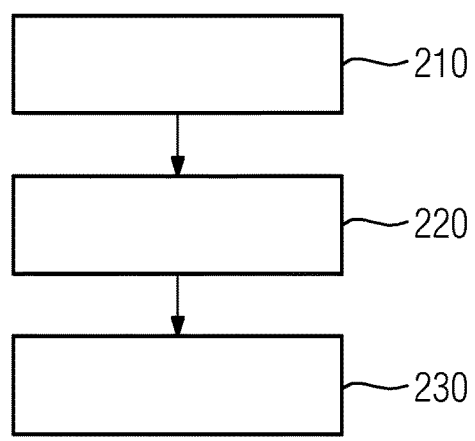
FIG. 8 shows a block diagram of one embodiment of a method for producing a radio-frequency shielding unit.

FIG. 8 shows an overview of various method acts that may be performed advantageously in producing the radio-frequency shielding unit.

In act 210, starting from a support layer 110 having a first conducting layer 120, the insulating layer 130 is applied to the first conducting layer 120 at least in part by a spray-coating process and/or a printing process.

In act 220, the second conducting layer 140 is applied to the insulating layer 130 at least in part by a spray-coating process and/or a printing process. A paste containing copper and/or aluminum and/or carbon nanotubes, for example, may be applied by the printing process.

In act 230, the thickness of the second conducting layer 140 is increased by an electrochemical process.

The radio-frequency shielding unit of one or more of the present embodiments includes two electrically conductive layers that may also be slotted. Unlike previous radio-frequency shielding units, a significantly thinner intermediate layer between the two electrically conductive layers may be produced. It is thereby possible to improve significantly the properties of the radio-frequency shielding unit, for example, for low $B_0$ field strengths.

The method described in detail above and the presented acquisition pattern generation unit and magnetic resonance apparatus are exemplary embodiments that may be modified by a person skilled in the art in many ways without departing from the scope of the invention. In addition, the use of the indefinite article "a" or "an" does not rule out the possibility of there also being more than one of the features concerned. The term "unit" does not exclude the possibility that the components in question consist of a plurality of interacting sub-components, which may also be spatially distributed if applicable.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A radio-frequency shielding unit for shielding a radio-frequency antenna unit of a magnetic resonance apparatus, the radio-frequency shielding unit comprising:
   a support layer;
   a first conducting layer;
   an electrically isolating insulating layer; and
   a second conducting layer,
   wherein the first conducting layer is arranged between the support layer and the electrically isolating insulating layer,
   wherein the electrically isolating insulating layer is arranged between the first conducting layer and the second conducting layer,
   wherein the electrically isolating insulating layer has a maximum layer thickness of 50 μm, and
   wherein the electrically isolating insulating layer is at least partly spray-coated, printed, or spray-coated and printed on the first conducting layer.

2. The radio-frequency shielding unit of claim 1, wherein the first conducting layer is a copper layer.

3. The radio-frequency shielding unit of claim 1, wherein the first conducting layer, the second conducting layer, or the first conducting layer and the second conducting layer comprise at least one discontinuity.

4. The radio-frequency shielding unit of claim 1, wherein the electrically isolating insulating layer has a dielectric constant of at least 2.

5. The radio-frequency shielding unit of claim 1, wherein the electrically isolating insulating layer comprises polymers, nanoparticles, or polymers and nanoparticles.

6. The radio-frequency shielding unit of claim 1, further comprising at least one additional insulating layer and at least one additional conducting layer.

7. The radio-frequency shielding unit of claim 6, wherein the at least one additional insulating layer and the at least one additional conducting layer have a different lateral extent compared with the support layer, the first conducting layer, the electrically isolating insulating layer, the second conducting layer, or any combination thereof.

8. A magnetic resonance apparatus comprising:
   a radio-frequency antenna unit;
   a gradient coil unit; and
   a radio-frequency shielding unit that is arranged between the radio-frequency antenna unit and the gradient coil unit, the radio-frequency shielding unit comprising:
      a support layer;
      a first conducting layer;
      an electrically isolating insulating layer; and
      a second conducting layer,
   wherein the first conducting layer is arranged between the support layer and the electrically isolating insulating layer,
   wherein the electrically isolating insulating layer is arranged between the first conducting layer and the second conducting layer,
   wherein the electrically isolating insulating layer has a maximum layer thickness of 50 μm, and
   wherein the electrically isolating insulating layer is at least partly spray-coated, printed, or spray-coated and printed on the first conducting layer.

9. The magnetic resonance apparatus of claim 8, wherein the first conducting layer is a copper layer.

10. The magnetic resonance apparatus of claim 8, wherein the first conducting layer, the second conducting layer, or the first conducting layer and the second conducting layer comprise at least one discontinuity.

* * * * *